(12) United States Patent
Anderson et al.

(10) Patent No.: US 10,607,992 B2
(45) Date of Patent: Mar. 31, 2020

(54) SEMICONDUCTOR DEVICE AND METHOD OF FORMING THE SEMICONDUCTOR DEVICE

(71) Applicant: International Business Machines Corporation, Armonk, NY (US)

(72) Inventors: Brent Alan Anderson, Jericho, VT (US); Shawn P. Fetterolf, Cornwall, VT (US); Terence B. Hook, Jericho, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/859,350

(22) Filed: Dec. 30, 2017

(65) Prior Publication Data

US 2018/0122807 A1 May 3, 2018

Related U.S. Application Data

(63) Continuation of application No. 15/294,467, filed on Oct. 14, 2016, now Pat. No. 9,947,664.

(51) Int. Cl.
| | | |
|---|---|---|
| H01L 21/00 | (2006.01) | |
| H01L 27/092 | (2006.01) | |
| H01L 29/78 | (2006.01) | |
| H01L 27/088 | (2006.01) | |
| H01L 21/8234 | (2006.01) | |

(Continued)

(52) U.S. Cl.
CPC .... *H01L 27/0924* (2013.01); *H01L 21/82385* (2013.01); *H01L 21/823431* (2013.01); *H01L 21/823871* (2013.01); *H01L 21/823885* (2013.01); *H01L 25/071* (2013.01); *H01L 27/0688* (2013.01); *H01L 27/0886* (2013.01); *H01L 27/092* (2013.01); *H01L 29/7827* (2013.01); *H01L 29/7831* (2013.01)

(58) Field of Classification Search
CPC ............... H01L 27/0924; H01L 23/528; H01L 27/0886; H01L 21/823431
See application file for complete search history.

(56) References Cited

U.S. PATENT DOCUMENTS

| | | |
|---|---|---|
| 5,612,563 A | 3/1997 | Fitch et al. |
| 5,714,394 A | 2/1998 | Kadosh et al. |

(Continued)

FOREIGN PATENT DOCUMENTS

| | | | | |
|---|---|---|---|---|
| FR | 2789227 A1 * | 8/2000 | ......... | H01L 27/0203 |
| FR | 2789227 A1 | 8/2000 | | |

(Continued)

OTHER PUBLICATIONS

United States Notice of Allowance dated Dec. 12, 2017 in U.S. Appl. No. 15/294,467.

(Continued)

*Primary Examiner* — Laura M Menz
(74) *Attorney, Agent, or Firm* — Vazken Alexanian; McGinn IP Law Group, PLLC

(57) ABSTRACT

A semiconductor device includes a semiconductor fin formed on a substrate, a first gate formed around the semiconductor fin, and a second gate formed around the semiconductor fin below the first gate and separated from the first gate.

18 Claims, 9 Drawing Sheets

(51) Int. Cl.
*H01L 21/8238* (2006.01)
*H01L 25/07* (2006.01)
*H01L 27/06* (2006.01)

(56) References Cited

U.S. PATENT DOCUMENTS

| | | | |
|---|---|---|---|
| 6,118,159 A | 9/2000 | Willer et al. | |
| 6,208,535 B1 | 3/2001 | Parks | |
| 8,173,987 B2 * | 5/2012 | Lung | G11C 13/0004 257/2 |
| 8,659,072 B2 | 2/2014 | Ou et al. | |
| 8,692,310 B2 | 4/2014 | Suh et al. | |
| 8,729,609 B2 * | 5/2014 | Johnson | H01L 21/76895 257/204 |
| 9,087,897 B1 * | 7/2015 | Anderson | H01L 29/7827 |
| 9,324,623 B1 * | 4/2016 | Kim | H01L 21/823814 |
| 9,356,155 B2 | 5/2016 | Sandhu | |
| 9,490,177 B2 * | 11/2016 | Oh | H01L 21/823821 |
| 9,564,431 B2 * | 2/2017 | Colinge | H01L 29/7827 |
| 9,646,962 B1 * | 5/2017 | Liu | H01L 27/0255 |
| 9,793,356 B2 * | 10/2017 | Yoo | H01L 29/785 |
| 9,947,664 B1 * | 4/2018 | Anderson | H01L 21/823431 |
| 10,037,919 B1 * | 7/2018 | Xie | H01L 21/823487 |
| 10,090,412 B1 * | 10/2018 | Cheng | H01L 29/7827 |
| 2012/0119286 A1 * | 5/2012 | Kim | H01L 27/10876 257/329 |
| 2014/0146593 A1 * | 5/2014 | Tsai | G11C 11/21 365/148 |
| 2014/0346574 A1 * | 11/2014 | Cai | H01L 29/66795 257/288 |
| 2015/0129970 A1 * | 5/2015 | Xie | H01L 29/4916 257/368 |
| 2015/0236086 A1 * | 8/2015 | Colinge | H01L 29/7827 257/329 |
| 2015/0349078 A1 | 12/2015 | Masuoka et al. | |
| 2015/0349079 A1 | 12/2015 | Masuoka et al. | |
| 2015/0380548 A1 * | 12/2015 | Wang | H01L 29/7827 257/329 |
| 2016/0005763 A1 | 1/2016 | Masuoka et al. | |
| 2016/0005764 A1 | 1/2016 | Masuoka et al. | |
| 2016/0056173 A1 | 2/2016 | Masuoka et al. | |
| 2016/0056174 A1 | 2/2016 | Masuoka et al. | |
| 2016/0071928 A1 * | 3/2016 | Xie | H01L 29/785 257/401 |
| 2016/0079367 A1 * | 3/2016 | Yoo | H01L 29/785 257/77 |
| 2016/0181265 A1 * | 6/2016 | Regnier | H01L 29/7881 365/185.29 |
| 2016/0181399 A1 * | 6/2016 | Jun | H01L 21/76816 438/294 |
| 2016/0372414 A1 * | 12/2016 | Song | H01L 21/823821 |
| 2017/0186882 A1 * | 6/2017 | Koldiaev | H01L 21/845 |
| 2017/0287911 A1 * | 10/2017 | Nowak | H01L 27/092 |
| 2017/0373188 A1 * | 12/2017 | Mochizuki | H01L 29/7827 |
| 2018/0108659 A1 * | 4/2018 | Anderson | H01L 21/823431 |
| 2018/0122807 A1 * | 5/2018 | Anderson | H01L 21/823431 |
| 2018/0254218 A1 * | 9/2018 | Cheng | H01L 21/823462 |
| 2018/0331212 A1 * | 11/2018 | Zang | H01L 29/7827 |
| 2019/0051748 A1 * | 2/2019 | Balakrishnan | H01L 29/7827 |
| 2019/0081156 A1 * | 3/2019 | Veloso | H01L 21/02236 |
| 2019/0214392 A1 * | 7/2019 | Xu | H01L 27/1104 |

FOREIGN PATENT DOCUMENTS

| | | | | |
|---|---|---|---|---|
| WO | WO 2000/046855 A1 | 8/2000 | | |
| WO | WO-0046855 A1 * | 8/2000 | | H01L 27/0203 |
| WO | WO 0046855 A1 | 8/2000 | | |
| WO | WO 2015/015565 A1 | 2/2015 | | |
| WO | WO 2015/015566 A1 | 2/2015 | | |
| WO | WO 2015/019469 A1 | 2/2015 | | |
| WO | WO 2015/019470 A1 | 2/2015 | | |
| WO | WO 2015/033381 A1 | 3/2015 | | |
| WO | WO 2015/033382 A1 | 3/2015 | | |

OTHER PUBLICATIONS

United States Office Action dated Sep. 20, 2017 in U.S. Appl. No. 15/294,467.

* cited by examiner

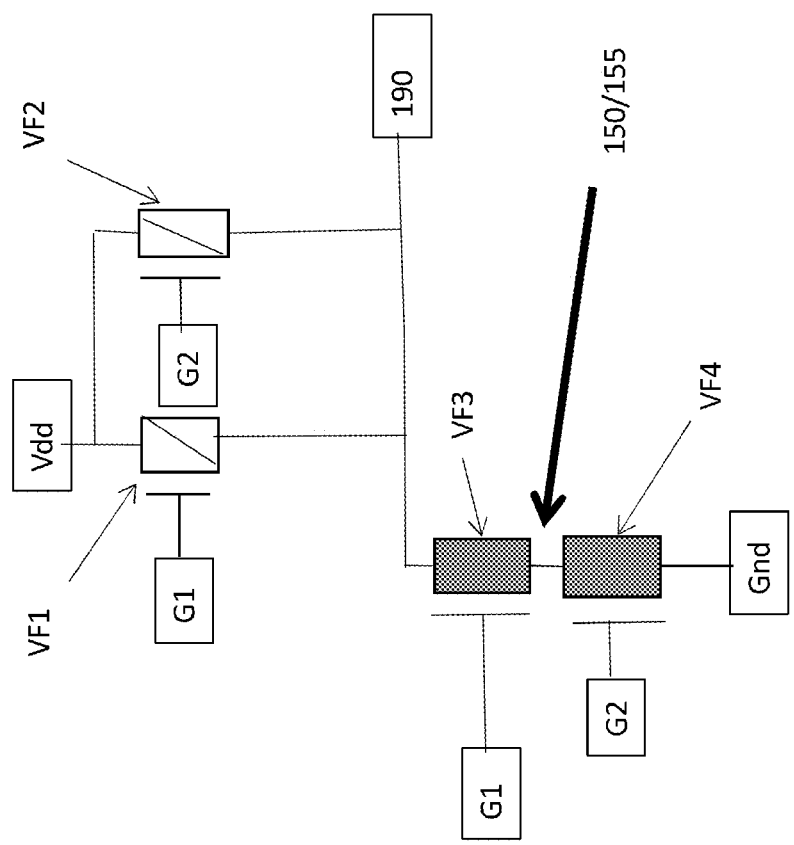

402

SEMICONDUCTOR DEVICE AND METHOD OF FORMING THE SEMICONDUCTOR DEVICE

The present application is a Continuation application of U.S. patent application Ser. No. 15/294,467, which was filed on Oct. 14, 2016.

BACKGROUND

The present invention relates generally to a semiconductor device and method of making the semiconductor device and, more particularly, to a semiconductor device which includes first and second vertical field effect transistors (VFETs) connected in parallel and third and fourth VFETs connected in series.

Related art devices such as NAND and NOR devices are formed using complementary metal oxide semiconductor (CMOS) technology. These CMOS devices may be formed, for example, by using a traditional (e.g., horizontal) transistor configuration.

For example, in forming a CMOS NAND device, an n-well is formed in a p-type substrate, and a pair of p-type field effect transistors (pFETs) is formed in the n-well, and connected in parallel. A pair of n-type FETs (nFETs) is then formed on the substrate adjacent to the pair of nFETs, and connected in series.

Thus, the related art CMOS NAND device has a physical layout that covers a large area of the substrate.

SUMMARY

An exemplary aspect of the present invention is directed to a semiconductor device includes a first vertical field effect transistor (VFET) formed on a substrate, and including a first fin and a first gate formed on the first fin, a second VFET formed on the substrate and connected in parallel with the first VFET, and including a second fin and a second gate formed on the second fin, a third VFET formed on the substrate and including a third fin, the first and second gates being formed on the third fin, and a fourth VFET formed on the substrate and connected in series with the third VFET, and including a fourth fin, the first and second gates being formed on the fourth fin.

Another exemplary aspect of the present invention is directed to a semiconductor device including a first vertical field effect transistor (VFET) formed on a substrate, and including a first fin and a first gate formed on the first fin, a second VFET formed on the substrate and connected in parallel with the first VFET, and including a second fin and a second gate formed on the second fin, a third VFET formed on the substrate and including a third fin, the first and second gates being formed on the third fin, and a fourth VFET formed on the substrate and connected in series with the third VFET, and including a fourth fin, the first and second gates being formed on the fourth fin. The first gate is formed on the third fin under the second gate, the third fin includes an undoped region between the first and second gates, and the undoped region is gated by a fringing effect which couples the first and second gates, and the first gate is formed on the fourth fin under the second gate, the fourth fin includes an undoped region between the first and second gates, and the undoped region is gated by a fringing effect which couples the first and second gates.

Another exemplary aspect of the present invention is directed to a method of forming a semiconductor device. The method includes forming a first vertical field effect transistor (VFET) on a substrate, the first VFET including a first fin and a first gate formed on the first fin, forming a second VFET on the substrate, the second VFET being connected in parallel with the first VFET, and including a second fin and a second gate formed on the second fin, forming a third VFET on the substrate, the third VFET including a third fin, and the first and second gates being formed on the third fin, and forming a fourth VFET on the substrate, the fourth VFET being connected in series with the third VFET, and including a fourth fin, the first and second gates being formed on the fourth fin.

With its unique and novel features, the exemplary aspects of the present invention may reduce an area required for a physical layout of the device (i.e., increase basic universal gate functionality density) and reduce wiring length, resulting in a reduction in design effort and metal layer clutter as well as line loss effects which degrade performance.

BRIEF DESCRIPTION OF THE DRAWINGS

The exemplary aspects of the present invention will be better understood from the following detailed description of the exemplary embodiments of the invention with reference to the drawings, in which:

FIG. 4A is schematic diagram of a semiconductor device 401, according to an exemplary aspect of the present invention.

DETAILED DESCRIPTION

Figure 1:
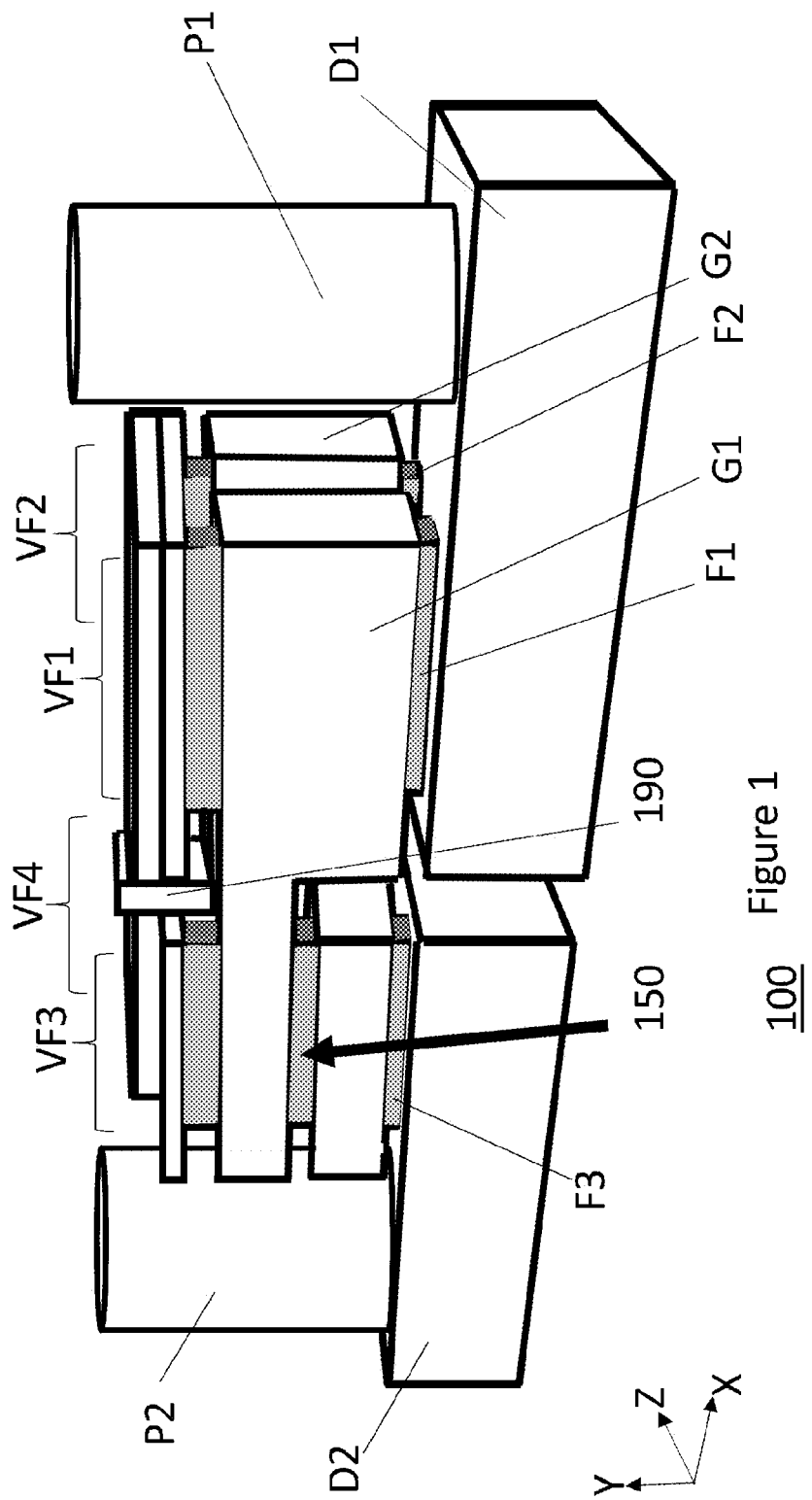
FIG. 1 illustrates a first side of the semiconductor device 100, according to an exemplary aspect of the present invention, according to an exemplary aspect of the present invention.

The invention will now be described with reference to FIGS. 1-9, in which like reference numerals refer to like parts throughout. It is emphasized that, according to common practice, the various features of the drawing are not necessarily to scale. On the contrary, the dimensions of the various features can be arbitrarily expanded or reduced for clarity. Exemplary embodiments are provided below for illustration purposes and do not limit the claims.

Scaling of the related art CMOS NAND devices (e.g., including traditional transistors) is becoming more and more challenging. One option to address this is to move high-level design/circuit structures to a lower integration level.

By moving a NAND or NOR to a lower level, an exemplary aspect of the present invention may increase basic universal gate functionality density, and reduce wiring length. This reduction will yield a savings in not only design effort, but also metal layer clutter as well as line loss effects which degrade performance.

Figure 2:
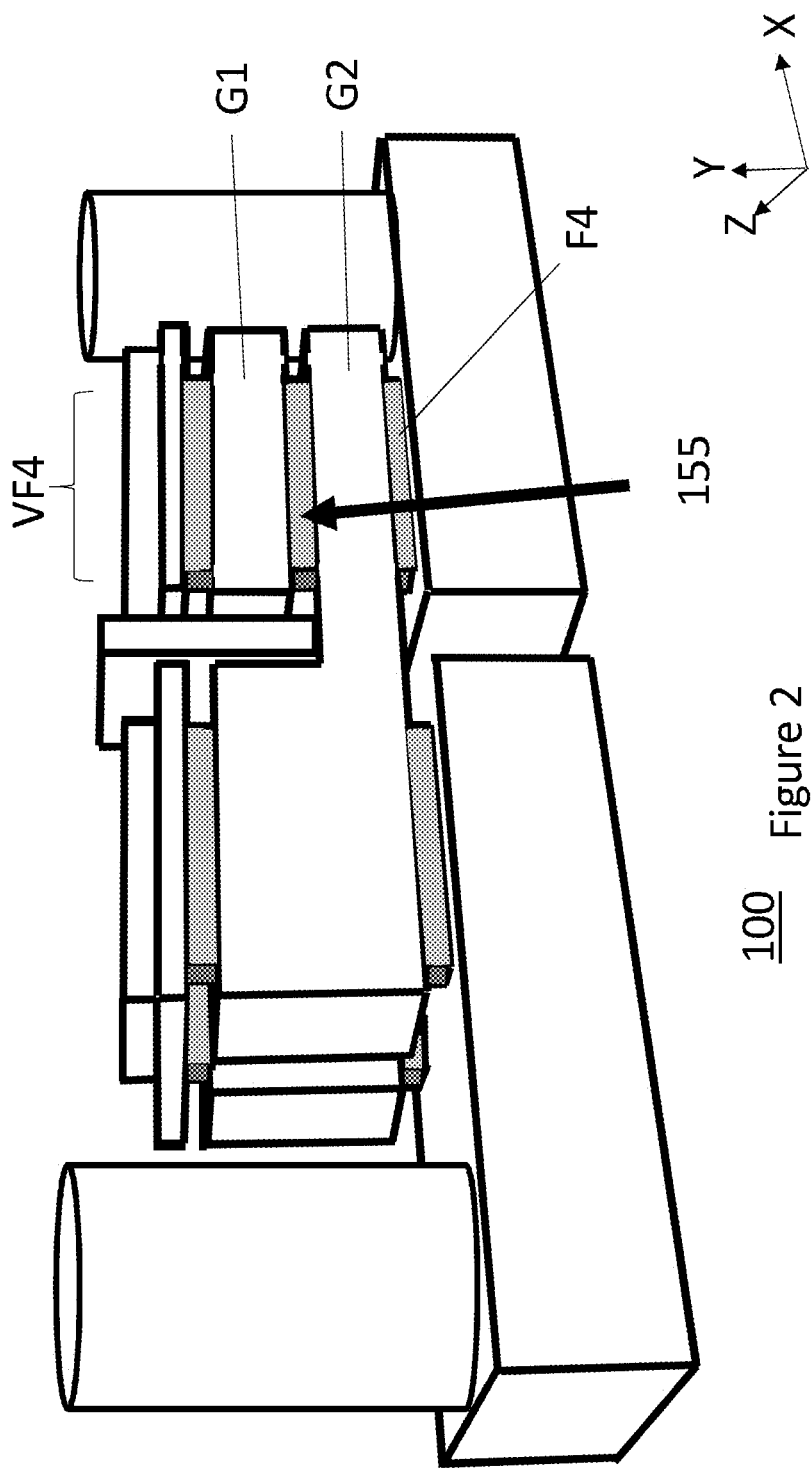
FIG. 2 illustrates a second side of the semiconductor device 100 opposite the first side, according to an exemplary aspect of the present invention.

FIGS. 1 and 2 illustrate a semiconductor device 100, according to an exemplary aspect of the present invention.

In particular, FIG. 1 illustrates a first side of the semiconductor device 100, according to an exemplary aspect of the present invention, and FIG. 2 illustrates a second side of the semiconductor device 100 opposite the first side, according to an exemplary aspect of the present invention.

As illustrated in FIGS. 1 and 2, the semiconductor device 100 includes a first vertical field effect transistor (VFET) VF1 formed on a substrate, and including a first fin F1 and a first gate G1 formed on the first fin F1, a second VFET VF2 formed on the substrate and connected in parallel with the first VFET VF1, and including a second fin F2 and a second gate G2 formed on the second fin F2, a third VFET VF3 formed on the substrate and including a third fin F3, the first and second gates G1, G2 being formed on the third fin F3, and a fourth VFET VF4 (see FIG. 2) formed on the substrate and connected in series with the third VFET VF3, and including a fourth fin F4, the first and second gates G1, G2 being formed on the fourth fin F4.

The semiconductor device 100 may also include a first diffusion region D1 and a first power supply contact P1 formed on the first diffusion region D1. The semiconductor device 100 may also include a second diffusion region D2 and a second power supply contact P2 formed on the second diffusion region D2.

The semiconductor device 100 may be configured as either a complementary metal oxide semiconductor (CMOS) NAND device (e.g., a 2WNAND logic gate) or a CMOS NOR device (e.g., a 2WNOR logic gate).

In particular, if the first and second VFETs VF1, VF2 (connected in parallel) are p-type VFETs and the third and fourth VFETs VF3, VF4 (connected in series) are n-type VFETs, then the semiconductor device 100 is configured as a (CMOS) NAND device. In this case, the first diffusion region D1 would be a p-type diffusion region, the second diffusion region D2 would be an n-type diffusion region, the first power supply contact P1 would be a $V_{DD}$ contact, and the second power supply contact P2 would be a ground contact.

On the other hand, if the first and second VFETs VF1, VF2 (connected in parallel) are n-type VFETs and the third and fourth VFETs VF3, VF4 (connected in series) are p-type VFETs, then the semiconductor device 100 is configured as a (CMOS) NOR device. In this case, the first diffusion region D1 would be an n-type diffusion region, the second diffusion region D2 would be a p-type diffusion region, the first power supply contact P1 would be a ground contact, and the second power supply contact P2 would be a $V_{DD}$ contact.

As illustrated in FIGS. 1 and 2, the first, second, third and fourth fins F1-F4 may be formed of a semiconductor material (e.g., silicon) and may form a channel region of the first, second, third and fourth VFETs VF1-VF4, respectively. The gates G1 and G2 may be formed of conductive material such as polysilicon or metal, and may wrap around the fins F1-F4 in the X-direction and Z-direction (e.g., in a direction substantially parallel to a surface of the diffusion regions D1, D2).

The first gate G1 may be formed on the third fin F3 either above or beneath the second gate G2. For example, as illustrated in FIG. 1, the first gate G1 is formed on the third fin F3 above the second gate G2.

Similarly, the first gate G1 may be formed on the fourth fin F4 either above or beneath the second gate G2. For example, as illustrated in FIG. 2, the first gate G1 is formed on the fourth fin F4 above the second gate G2.

As illustrated in FIG. 1, a width in a Y-direction of the first gate G1 on the first fin F1 is greater than a width in the Y-direction of first gate G1 on the third fin F3. Similarly, as illustrated in FIG. 2, a width in the Y-direction of the second gate G2 on the second fin F2 is greater than a width in the Y-direction of second gate G2 on the fourth fin F3.

In particular, a width in a Y-direction of the first gate G1 on the first fin F1 may be in a range from 30 nm to 60 nm, whereas a width in the Y-direction of first gate G1 on the third fin F3 may be in a range from 15 nm to 25 nm. Similarly, as illustrated in FIG. 2, a width in the Y-direction of the second gate G2 on the second fin F2 may be in a range from 30 nm to 60 nm, whereas a width in the Y-direction of second gate G2 on the fourth fin F4 may be in a range from 15 nm to 25 nm.

Generally, the semiconductor material of the first, second, third and fourth fins F1-F4 may be doped semiconductor material having a dopant concentration in a range from $1 \times 10^{15}$ cm$^{-3}$ to $5 \times 10^{18}$ cm$^{-3}$ although would typically be virtually undoped.

An entirety of the first and second fins F1, F2 (or at least the portions on which the first and second gates G1, G2 are formed) may be doped semiconductor material. However, at least a portion 150 of the semiconductor material of the third fin F3 which is between the first and second gates G1, G2 is formed of undoped semiconductor material. This portion 150 is a region of the third fin F3 that may be gated by a gate fringing effect. A width of the portion 150 in the Z-direction (e.g., a distance between the first and second gates G1, G2 on the third fin F3) may be, for example, in a range from 1 nm to 4 nm (e.g., 2 nm to 3 nm), in order to provide the gate fringing effect.

Similarly, at least a portion 155 of the semiconductor material of the fourth fin F4 which is between the first and second gates G1, G2 is formed of undoped semiconductor material. This portion 155 is a region of the fourth fin F4 that may be gated by the gate fringing effect. A width of the portion 155 in the Z-direction (e.g., a distance between the first and second gates G1, G2 on the fourth fin F4) may be, for example, in a range from 1 nm to 4 nm (e.g., 2 nm to 3 nm), in order to provide the gate fringing effect.

The gate fringing effect is an electric field leakage through a periphery of the first and second gates G1, G2, which may couple the first and second gates G1, G2 (e.g., form a device-device interconnect). That is, the gate fringing effect may cause an intergate effect (e.g., inversion layer) in the channel of the third and fourth VFETs VF3, VF4 (e.g., in the third and fourth fins F3, F4). This effect may increase as the size of the semiconductor device 100 is reduced.

Referring again to FIG. 1, the semiconductor device 100 may also include an output contact 190 for providing an output signal of the semiconductor device 100 (e.g., NAND device or NOR device). In particular, the output contact 190 may be formed on (e.g., above in the Z-direction) the first, second, third and fourth fins F1-F4, and between the first and second fins F1, F2 on one side, and the third and fourth fins F3, F4 on the other side.

The output contact 190 may constitute at least a part of a device-bus interconnect in the semiconductor device 100.

Figure 3B:
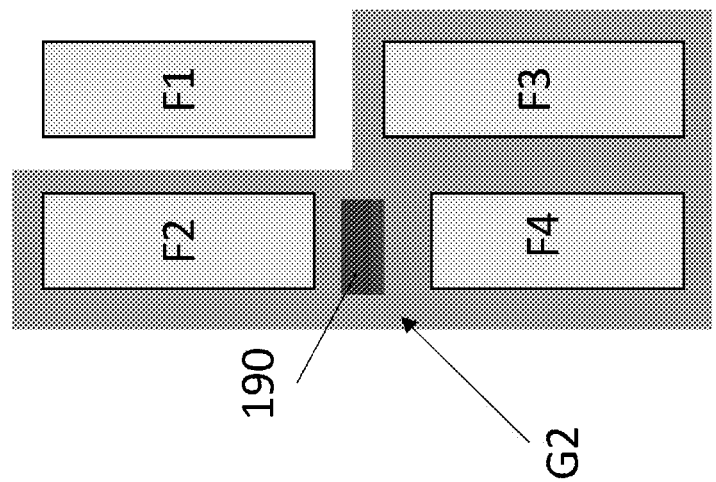
FIG. 3B illustrates a top view of a configuration of the second gate G2, according to an exemplary aspect of the present invention.
Figure 3A:
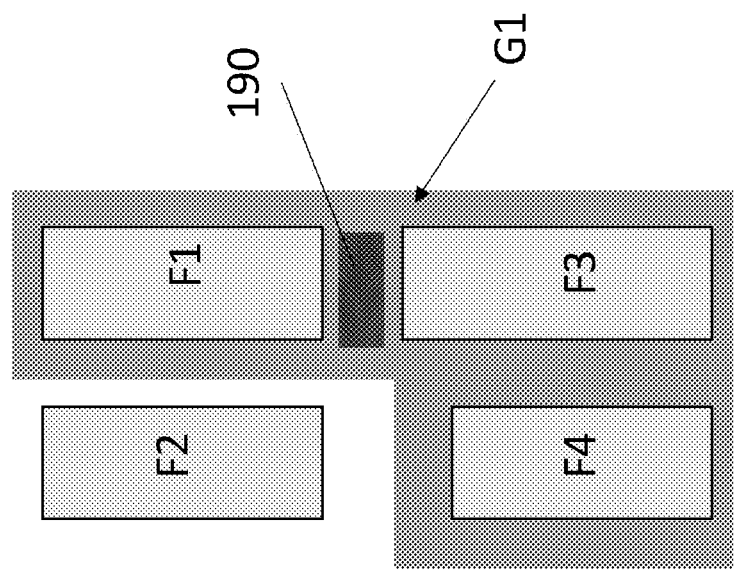
FIG. 3A illustrates a top view of a configuration of the first gate G1, according to an exemplary aspect of the present invention.

Referring again to the drawings, FIGS. 3A and 3B illustrate a configuration of the first and second gates G1, G2, respectively.

In particular, FIG. 3A illustrates a top view of a configuration of the first gate G1, according to an exemplary aspect of the present invention. As illustrated in FIG. 3A, the first gate G1 is formed around the first, third and fourth fins F1, F3 and F4, but not around the second fin F2. As illustrated in FIG. 3A, the contact 190 may be formed between the first and third fins F1, F3.

FIG. 3B illustrates a top view of a configuration of the second gate G2, according to an exemplary aspect of the present invention. As illustrated in FIG. 3B, the second gate G2 is formed around the second, third and fourth fins F2, F3 and F4, but not around the first fin F1. As illustrated in FIG. 3B, the contact 190 may be formed between the second and fourth fins F2, F4.

It should be noted that this configuration of the gates G1, G2 may be the same regardless of whether the semiconductor device 100 is configured as a CMOS NAND device or a CMOS NOR device.

FIG. 4A is schematic diagram of a semiconductor device 401, according to an exemplary aspect of the present invention. The semiconductor device 401 may have a physical configuration as illustrated in FIGS. 1 and 2, and more particularly, is configured as a CMOS NAND device.

That is, as illustrated in FIG. 4A, in the semiconductor device 401, the first and second VFETs VF1, VF2 are p-type VFETs that are connected in parallel, and the third and fourth VFETs VF3, VF4 are n-type VFETs that are connected in series). Further, the first and second VFETs VF1, VF2 are connected to $V_{DD}$ and the third and fourth VFETs VF3, VF4 are connected to ground. An output contact 190 (e.g., device-bus interconnect) is connected between the first and second VFETs VF1, VF2 on one side, and the third and fourth VFETS VF3, VF4 on the other side.

The connection (e.g., coupling) between VF3 and VF4 may be provided by the gate fringing effect at regions 150 and 155, as described above.

Figure 4B:
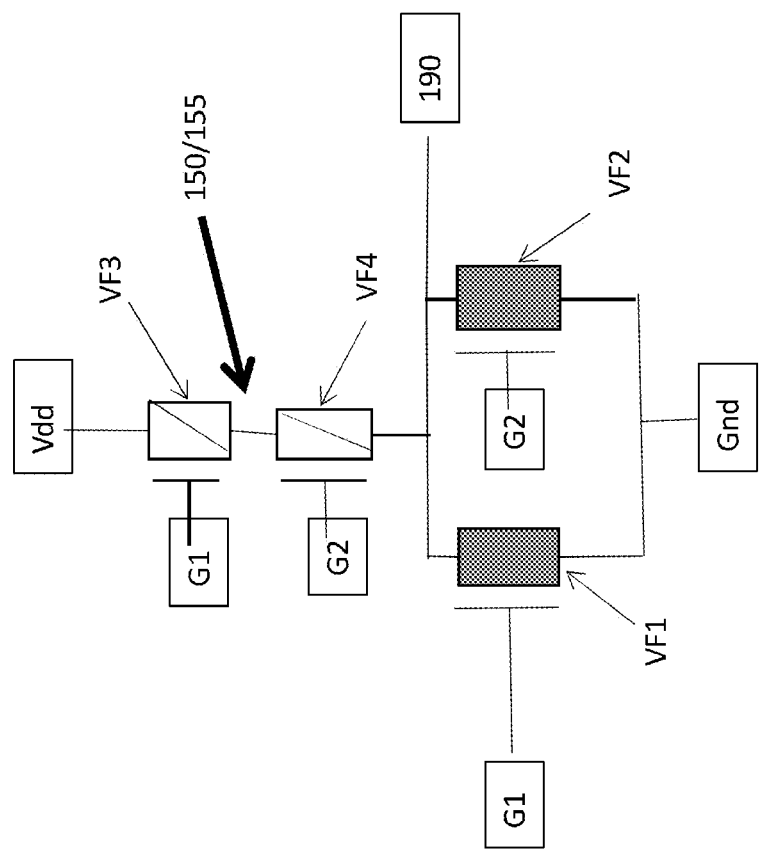
FIG. 4B is schematic diagram of a semiconductor device 402, according to an exemplary aspect of the present invention.

FIG. 4B is schematic diagram of a semiconductor device 402, according to an exemplary aspect of the present invention. The semiconductor device 402 may have a physical configuration as illustrated in FIGS. 1 and 2, and more particularly, is configured as a CMOS NOR device.

That is, as illustrated in FIG. 4B, in the semiconductor device 402, the first and second VFETs VF1, VF2 are n-type VFETs connected in parallel, and the third and fourth VFETs VF3, VF4 are p-type VFETs connected in series. Further, the first and second VFETs VF1, VF2 are connected to ground and the third and fourth VFETs VF3, VF4 are connected to $V_{DD}$. An output contact 190 (e.g., device-bus interconnect) is connected between the first and second VFETs VF1, VF2 on one side, and the third and fourth VFETS VF3, VF4 on the other side.

Again, the connection (e.g., coupling) between VF3 and VF4 may be provided by the gate fringing effect at regions 150 and 155, as described above.

Figure 5:
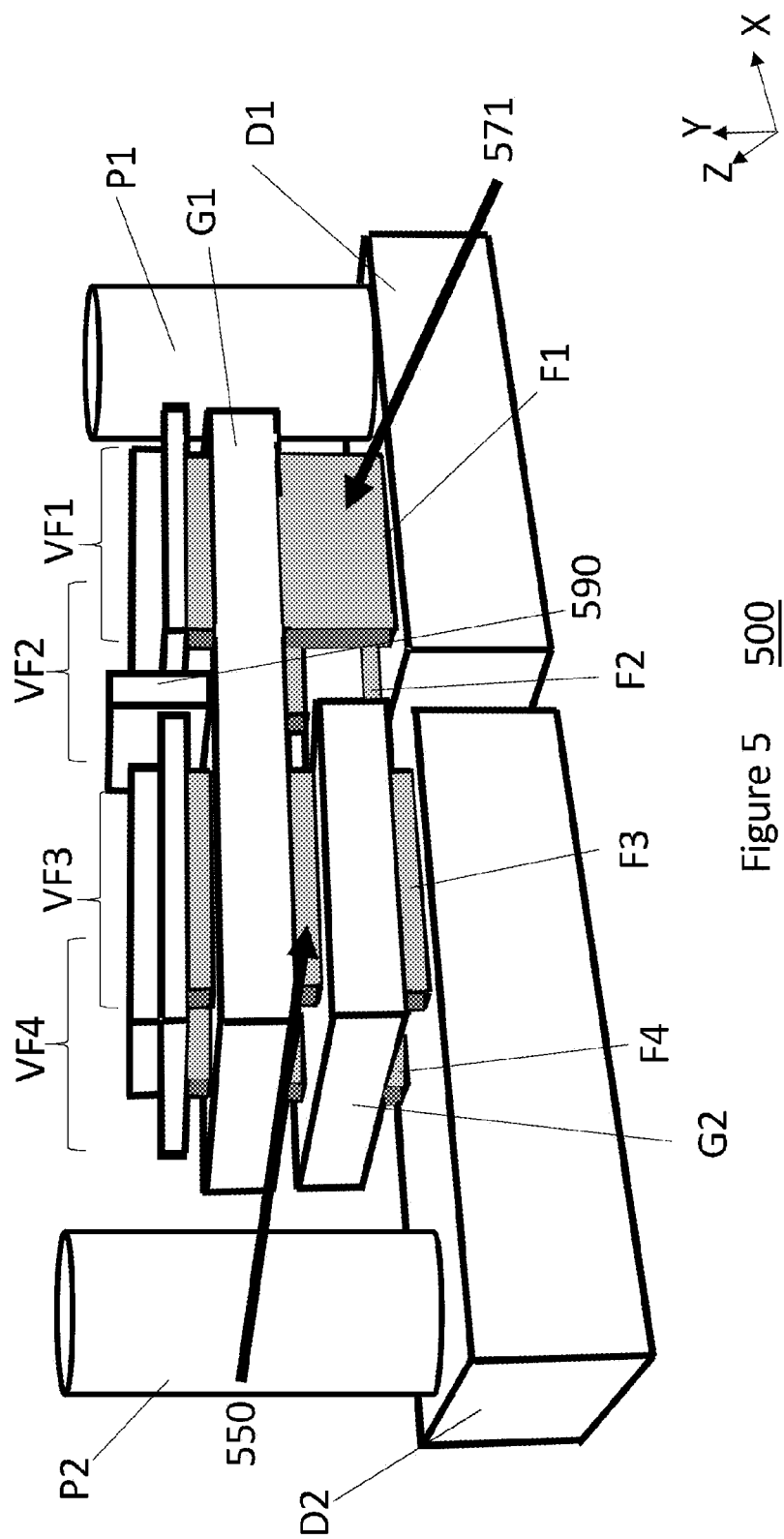
FIG. 5 illustrates a first side of the semiconductor device 500, according to another exemplary aspect of the present invention.
Figure 6:
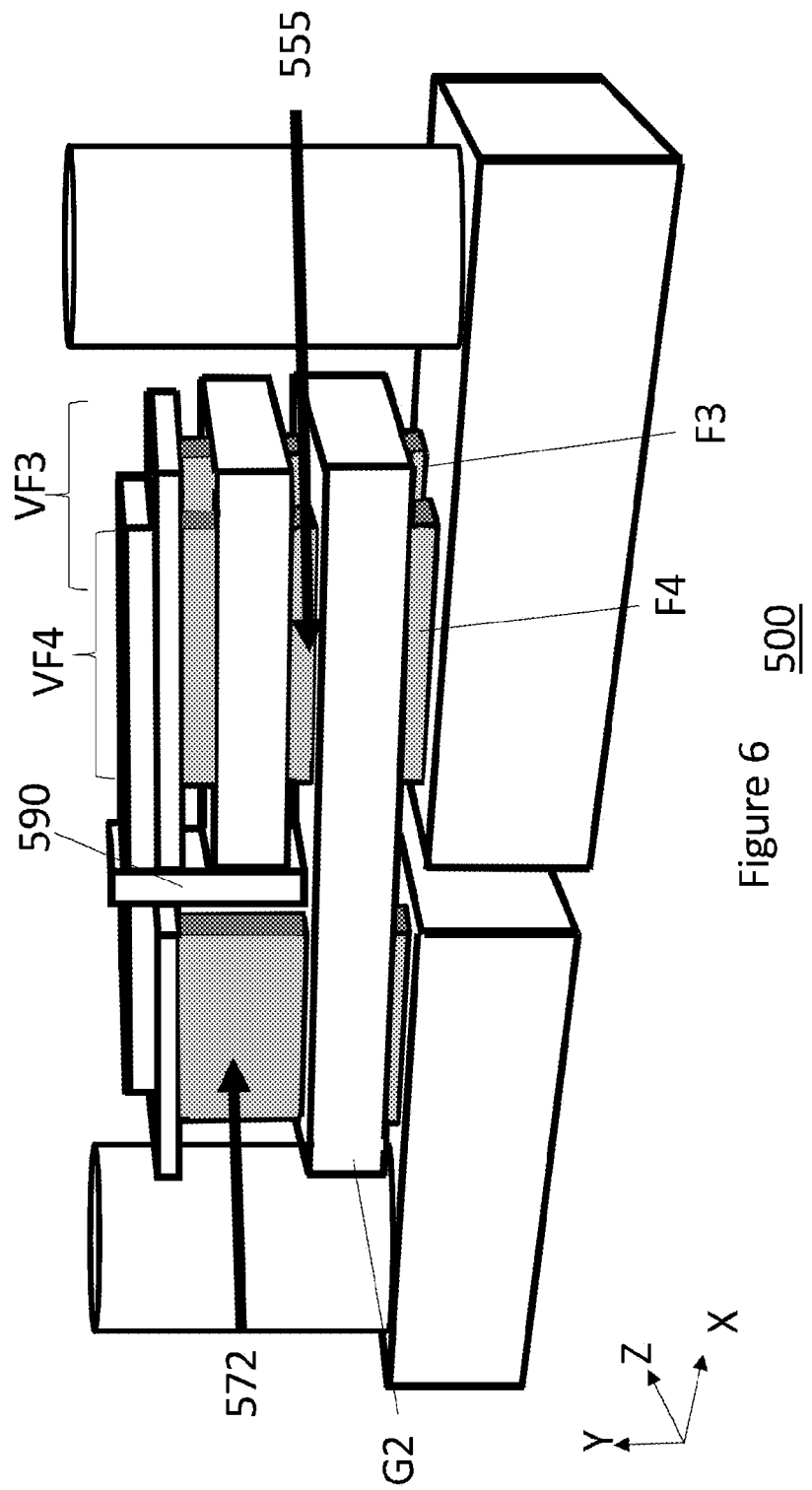
FIG. 6 illustrates a second side of the semiconductor device 500 opposite the first side, according to another exemplary aspect of the present invention.

Referring again to the drawings, FIGS. 5 and 6 illustrate a semiconductor device 500, according to another exemplary aspect of the present invention.

In particular, FIG. 5 illustrates a first side of the semiconductor device 500, according to another exemplary aspect of the present invention, and FIG. 6 illustrates a second side of the semiconductor device 500 opposite the first side, according to another exemplary aspect of the present invention.

As illustrated in FIGS. 5 and 6, the semiconductor device 500 includes a first vertical field effect transistor (VFET) VF1 formed on a substrate, and including a first fin F1 and a first gate G1 formed on the first fin F1, a second VFET VF2 formed on the substrate and connected in parallel with the first VFET VF1, and including a second fin F2 and a second gate G2 formed on the second fin F2, a third VFET VF3 formed on the substrate and including a third fin F3, the first and second gates G1, G2 being formed on the third fin F3, and a fourth VFET VF4 (see FIG. 6) formed on the substrate and connected in series with the third VFET VF3, and including a fourth fin F4, the first and second gates G1, G2 being formed on the fourth fin F4.

The semiconductor device 500 may also include a first diffusion region D1 and a first power supply contact P1 formed on the first diffusion region D1. The semiconductor device 100 may also include a second diffusion region D2 and a second power supply contact P2 formed on the second diffusion region D2.

The semiconductor device 500 may be configured as either a complementary metal oxide semiconductor (CMOS) NAND device (e.g., a 2WNAND logic gate) or a CMOS NOR device (e.g., a 2WNOR logic gate).

In particular, if the first and second VFETs VF1, VF2 (connected in parallel) are p-type VFETs and the third and fourth VFETs VF3, VF4 (connected in series) are n-type VFETs, then the semiconductor device 500 is configured as a (CMOS) NAND device. In this case, the first diffusion region D1 would be a p-type diffusion region, the second diffusion region D2 would be an n-type diffusion region, the first power supply contact P1 would be a $V_{DD}$ contact, and the second power supply contact P2 would be a ground contact.

On the other hand, if the first and second VFETs VF1, VF2 (connected in parallel) are n-type VFETs and the third and fourth VFETs VF3, VF4 (connected in series) are p-type VFETs, then the semiconductor device 500 is configured as a (CMOS) NOR device. In this case, the first diffusion region D1 would be an n-type diffusion region, the second diffusion region D2 would be a p-type diffusion region, the first power supply contact P1 would be a ground contact, and the second power supply contact P2 would be a $V_{DD}$ contact.

As illustrated in FIGS. 5 and 6, the first, second, third and fourth fins F1-F4 may be formed of a semiconductor material (e.g., silicon) and may form a channel region of the first, second, third and fourth VFETs VF1-VF4, respectively. The gates G1 and G2 may be formed of conductive material such as polysilicon or metal, and may wrap around the fins F1-F4 in the X-direction and Z-direction (e.g., in a direction substantially parallel to a surface of the diffusion regions D1, D2).

The first gate G1 may be formed on the third fin F3 either above or beneath the second gate G2. For example, as illustrated in FIG. 5, the first gate G1 is formed on the third fin F3 above the second gate G2.

Similarly, the first gate G1 may be formed on the fourth fin F4 either above or beneath the second gate G2. For example, as illustrated in FIG. 6, the first gate G1 is formed on the fourth fin F4 above the second gate G2.

It should be noted that a difference between the semiconductor device 500 in FIGS. 5 and 6, and the semiconductor device 100 in FIGS. 1 and 2, is that in the semiconductor device 100, a width in the Z-direction of the first gate G1 on the first fin F1 is greater than a width in the Z-direction of first gate G1 on the third fin F3 (see FIG. 1), and a width in the Z-direction of the second gate G2 on the second fin F2 is greater than a width in the Z-direction of second gate G2 on the fourth fin F3 (see FIG. 2).

However, in the semiconductor device 500, a width in the Z-direction of the first gate G1 on the first fin F1 may be substantially equal to a width in the Z-direction of first gate G1 on the third fin F3 (see FIG. 5), and a width in the Z-direction of the second gate G2 on the second fin F2 may be substantially equal to a width in the Z-direction of second gate G2 on the fourth fin F3 (see FIG. 6).

Further, the first fin F1 includes a region 571 between the first gate G1 and the diffusion region D1, that is doped (e.g., heavily doped) for conductivity, and the second fin F2 includes a region 572 between the second gate G2 and the output contact 590 (e.g., output contact) that is doped (e.g., heavily doped) for conductivity.

The regions 571, 572 may constitute at least a part of a device-bus interconnect in the semiconductor device 500.

The amount of doping in the regions 571, 572 may be the same or different, and may be greater than an amount of doping of the remaining portion of the first and second fins F1, F2 (e.g., the portions around which the first and second gates G1, G2 are wrapped). In particular, the amount of doping in the regions 571, 572 may be in a range from $1\times10^{19}$ cm$^{-3}$ to $1\times10^{22}$ cm$^{-3}$.

Further, at least a portion 550 of the semiconductor material of the third fin F3 which is between the first and second gates G1, G2 is formed of undoped semiconductor material. This portion 550 is a region of the third fin F3 that may be gated by a gate fringing effect. A width of the portion 550 in the Z-direction (e.g., a distance between the first and second gates G1, G2 on the third fin F3) may be, for example, in a range from 1 nm to 4 nm (e.g., 2 nm to 3 nm), in order to provide the gate fringing effect.

Similarly, at least a portion 555 of the semiconductor material of the fourth fin F4 which is between the first and second gates G1, G2 is formed of undoped semiconductor material. This portion 555 is a region of the fourth fin F4 that may be gated by the gate fringing effect. A width of the portion 555 in the Z-direction (e.g., a distance between the first and second gates G1, G2 on the fourth fin F4) may be, for example, in a range from 1 nm to 4 nm (e.g., 2 nm to 3 nm), in order to provide the gate fringing effect.

Similar to the semiconductor device 100, in the semiconductor device 500 the gate fringing effect is an electric field leakage through a periphery of the first and second gates G1, G2, which may couple the first and second gates G1, G2 (e.g., form a device-device interconnect). That is, the gate fringing effect may cause an intergate effect (e.g., inversion layer) in the channel of the third and fourth VFETs VF3, VF4 (e.g., in the third and fourth fins F3, F4).

Referring again to FIG. 5, the semiconductor device 500 may also include an output contact 590 for providing an output signal of the semiconductor device 500 (e.g., NAND device or NOR device). In particular, the output contact 590 may be formed on (e.g., above in the Z-direction) the first, second, third and fourth fins F1-F4, and between the first and second fins F1, F2 on one side, and the third and fourth fins F3, F4 on the other side.

The output contact 590 along with the regions 571, 572 may constitute a device-bus interconnect in the semiconductor device 500.

Figure 7:
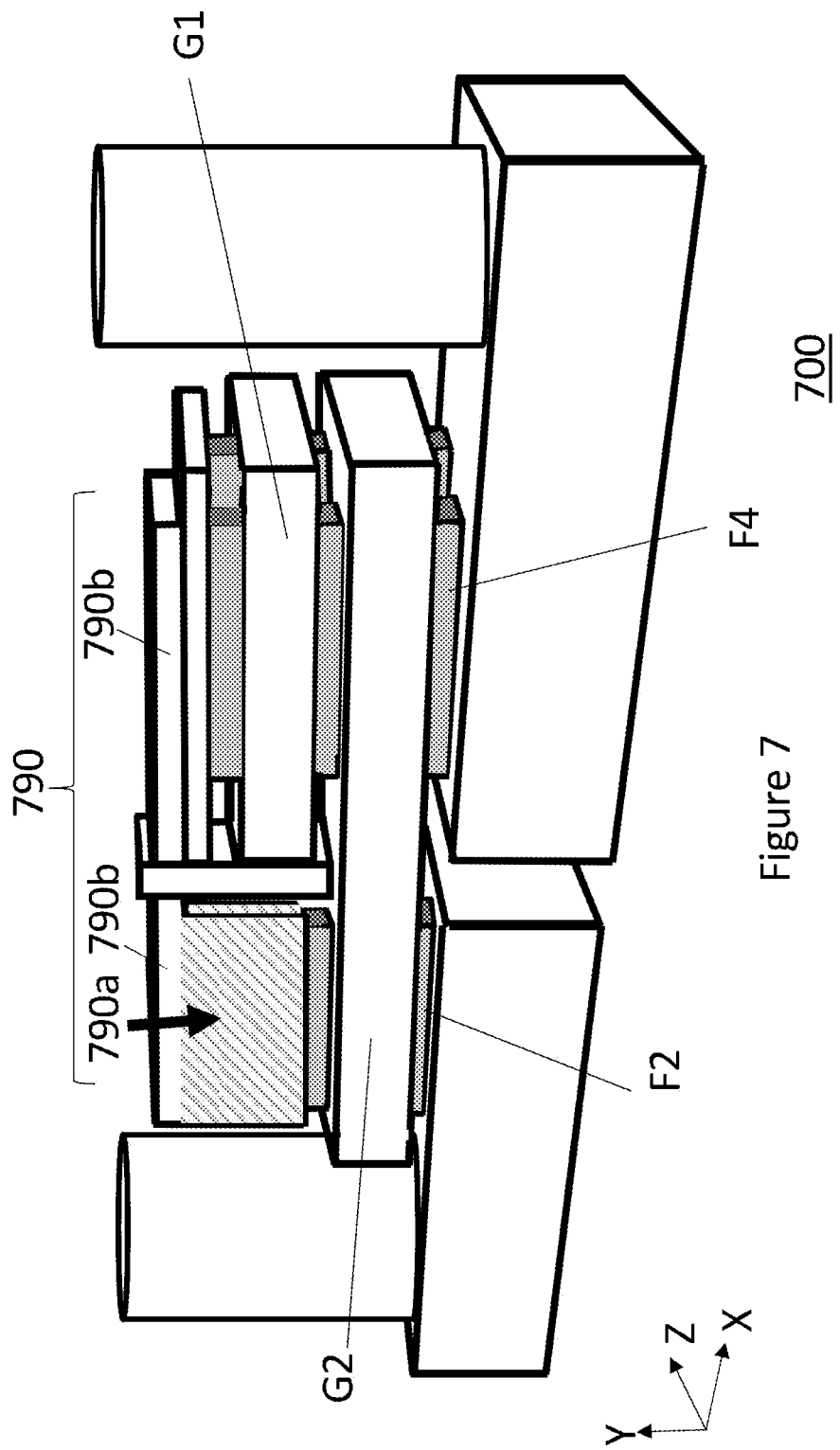
FIG. 7 illustrates a semiconductor device 700, according to another exemplary aspect of the present invention.
Figure 8:
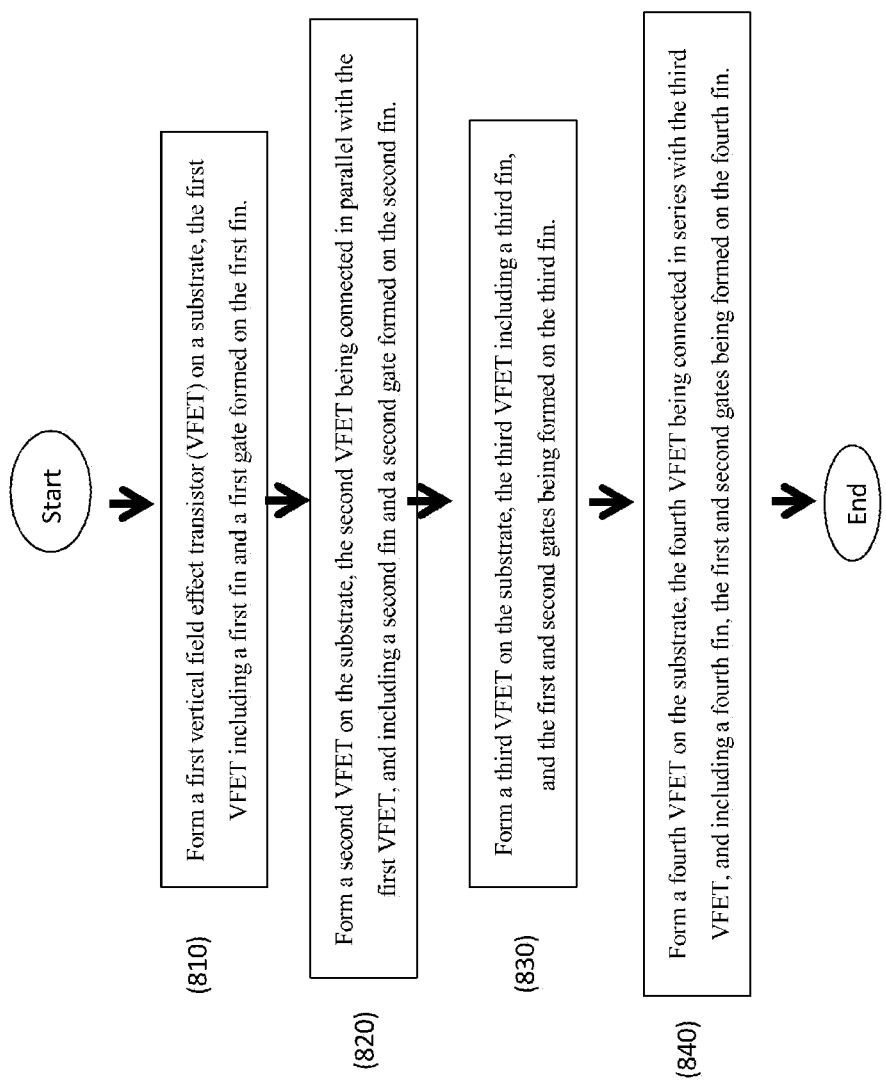
FIG. 8 illustrates a method 800 of forming a semiconductor device, according to another exemplary aspect of the present invention.

FIG. 7 illustrates a semiconductor device 700, according to another exemplary aspect of the present invention. The semiconductor device 700 is similar in structure to the semiconductor device 100 and the semiconductor device 500, but the semiconductor device 700 utilizes an extended contact 790 to constitute a part of the device-bus interconnect. That is, for example, the extended contact 790 in FIG. 7, may be used in place of the conductive region 572 in FIG. 6 to form a part of the device-bus interconnect.

As illustrated in FIG. 7, the extended contact 790 includes a lateral portion 790b which is formed on (e.g., over) the first, second, third and fourth fins F1-F4, and an extended portion 790a which is formed on the second fin F2, and extends down from the lateral portion 790b toward the second gate G2.

The extended portion 790a may have a length in the Y-direction in a range from 20 nm to 50 nm. In particular, the extended portion 790a may wrap around the second fin F2 in the X-direction and Z-direction, or may be formed on only a portion of the second fin F2 (e.g., only on an outer longitudinal side of the second fin F2).

Further, an end of the extended portion 790a in the Y-direction which is nearest to the second gate G2 may be formed to be substantially aligned with a bottom of the first gate G1 on the fourth fin F4. That is, the end of the extended portion 790a may be at least 5-10 nm from the second gate G2 in the Y-direction.

Other features and functions of the semiconductor device 700 may be similar to those of the semiconductor device 500 described above.

FIG. 9 illustrates a method 900 of forming a semiconductor device, according to another exemplary aspect of the present invention.

As illustrated in FIG. 9, the method 900 includes forming (910) a first vertical field effect transistor (VFET) on a substrate, the first VFET including a first fin and a first gate formed on the first fin, forming (920) a second VFET on the substrate, the second VFET being connected in parallel with the first VFET, and including a second fin and a second gate formed on the second fin, forming (930) a third VFET on the substrate, the third VFET including a third fin, and the first and second gates being formed on the third fin, and forming (940) a fourth VFET on the substrate, the fourth VFET being connected in series with the third VFET, and including a fourth fin, the first and second gates being formed on the fourth fin.

With its unique and novel features, the exemplary aspects of the present invention may reduce an area required for a physical layout of the device (i.e., increase basic universal gate functionality density) and reduce wiring length, resulting in a reduction in design effort and metal layer clutter as well as line loss effects which degrade performance.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive method and system is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A semiconductor device comprising:
    a first pair of vertical field effect transistors (VFETs); and
    a second pair of VFETs formed adjacent to the first pair of VFETs and comprising:
        a semiconductor fin formed on a substrate;
        a first gate formed around the semiconductor fin; and a second gate formed around the semiconductor fin below the first gate and separated from the first gate.

2. The semiconductor device of claim 1, wherein the first pair of VFETs comprises:
   a first vertical field effect transistor (VFET) formed on the substrate, and comprising a first fin and the first gate formed on the first fin; and
   a second VFET formed on the substrate and connected in parallel with the first VFET, and comprising a second fin and the second gate formed on the second fin; and
wherein the second pair of VFETs comprises:
   a third VFET formed on the substrate and comprising a third fin, the first and second gates being formed on the third fin; and
   a fourth VFET formed on the substrate and connected in series with the third VFET, and comprising the semiconductor fin as a fourth fin, the first and second gates being formed on the fourth fin.

3. The semiconductor device of claim 2, wherein the first and second VFETs comprise first and second p-type VFETs, respectively, and the third and fourth VFETs comprise first and second n-type VFETs, respectively, and the semiconductor device comprises a complementary metal oxide semiconductor (CMOS) NAND device.

4. The semiconductor device of claim 3, wherein the first and second VFETs are formed on an p-type substrate, and the third and fourth VFETs are formed on a n-type substrate, and
   wherein the device further comprises:
      a $V_{DD}$ contact formed on the p-type substrate; and
      a ground contact formed on the n-type substrate.

5. The semiconductor device of claim 2, wherein the first and second VFETs comprise first and second n-type VFETs, respectively, and the third and fourth VFETs comprise first and second p-type VFETs, respectively, and the semiconductor device comprises a complementary metal oxide semiconductor (CMOS) NOR device.

6. The semiconductor device of claim 5, wherein the first and second VFETs are formed on an n-type substrate, and the third and fourth VFETs are formed on a p-type substrate, and
   wherein the device further comprises:
      a $V_{DD}$ contact formed on the n-type substrate; and
      a ground contact formed on the p-type substrate.

7. The semiconductor device of claim 3, wherein the second p-type VFET is formed adjacent to the first p-type VFET in a first direction, and the second n-type VFET is formed adjacent to the first n-type VFET in the first direction, and
wherein the first n-type VFET is formed adjacent to the first p-type VFET in a second direction perpendicular to the first direction, and the second n-type VFET is formed adjacent to the second p-type FET in the second direction.

8. The semiconductor device of claim 2, wherein the first gate is formed on the third fin of the third VFET under the second gate.

9. The semiconductor device of claim 8, wherein the third fin of the third VFET comprises an undoped region between the first and second gates, and the undoped region is gated by a fringing effect which couples the first and second gates.

10. The semiconductor device of claim 9, wherein a distance between the first and second gates on the third fin is in a range from 1 nm to 4 nm.

11. The semiconductor device of claim 2, wherein the first gate is formed on the fourth fin of the fourth VFET under the second gate.

12. The semiconductor device of claim 11, wherein the fourth fin of the fourth VFET comprises an undoped region between the first and second gates, and the undoped region is gated by a fringing effect which couples the first and second gates.

13. The semiconductor device of claim 12, wherein a distance between the first and second gates on the fourth fin is in a range from 1 nm to 4 nm.

14. The semiconductor device of claim 2, wherein the first gate comprises a first width on the first fin and a second width on the third and fourth fins, the first width being greater than the second width, and
   wherein the second gate comprises a first width on the second fin and a second width on the third and fourth fins, the first width of the second gate being greater than the second width of the second gate.

15. The semiconductor device of claim 2, further comprising:
   a device-bus interconnect formed between the first and second fins, and the third and fourth fins.

16. The semiconductor device of claim 15, where the device-bus interconnect comprises an inversion layer.

17. The semiconductor device of claim 15, where the device-bus interconnect comprises a doped portion of the first, second, third and fourth fins.

18. The semiconductor device of claim 15, wherein the device-bus interconnect comprises a contact formed between the first and second fins, and the third and fourth fins.

* * * * *